United States Patent
Yin et al.

(10) Patent No.: US 12,190,951 B2
(45) Date of Patent: Jan. 7, 2025

(54) HIGHLY ENERGY-EFFICIENT CAM BASED ON SINGLE FeFET AND OPERATING METHOD THEREOF

(71) Applicant: ZHEJIANG UNIVERSITY, Zhejiang (CN)

(72) Inventors: Xunzhao Yin, Zhejiang (CN); Jiahao Cai, Zhejiang (CN); Cheng Zhuo, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 141 days.

(21) Appl. No.: 18/082,480

(22) Filed: Dec. 15, 2022

(65) Prior Publication Data
US 2023/0274781 A1 Aug. 31, 2023

(30) Foreign Application Priority Data
Feb. 28, 2022 (CN) .......................... 202210190672.8

(51) Int. Cl.
*G11C 15/04* (2006.01)
(52) U.S. Cl.
CPC .................................. *G11C 15/046* (2013.01)
(58) Field of Classification Search
CPC . G11C 15/046; G11C 11/223; G11C 16/0483; G11C 16/06; G11C 16/30; Y02D 10/00; G06F 30/392; G06F 30/398
See application file for complete search history.

(56) References Cited

U.S. PATENT DOCUMENTS

| | | | |
|---|---|---|---|
| 6,067,244 A * | 5/2000 | Ma | G11C 11/22 365/222 |
| 2019/0325963 A1* | 10/2019 | Noack | G11C 15/046 |
| 2021/0343341 A1* | 11/2021 | Strachan | G11C 15/046 |

OTHER PUBLICATIONS

Anh Tuan Do et al., "Design of a Power-Efficient CAM Using Automated Background Checking Scheme for Small Match Line Swing", 2013 Proceedings of the ESSCIRC (ESSCIRC), Oct. 2013, pp. 209-212.

Jing Li et al., "1Mb 0.41 μm2 2T-2R Cell Nonvolatile TCAM with Two-bit Encoding and Clocked Self-Referenced Sensing", 2013 Symposium on VLSI Circuits Digest of Technical Papers, Jun. 2013, pp. 104-105.

(Continued)

*Primary Examiner* — Jay W. Radke
(74) *Attorney, Agent, or Firm* — JCIPRNET

(57) ABSTRACT

Disclosed in the present invention are a highly energy-efficient CAM based on a single FeFET and an operating method thereof, which relate to a design of an FeFET-based memory suitable for low power consumption and high performance. A brand-new design of a CAM cell based on the single FeFET is achieved by fully utilizing the storage characteristics of the FeFET, so that the number of transistors is saved, the search energy consumption is reduced, and the nonvolatility of data storage is obtained. The present invention utilizes a 2T-1FeFET structure, and combines the advantages of the FeFET and CMOS. Without reducing performance, only one FeFET is utilized to implement a less area overhead and a lower energy consumption compared with a traditional CMOS-based CAM, and non-volatility is achieved.

6 Claims, 8 Drawing Sheets

(56) References Cited

OTHER PUBLICATIONS

Chengzhi Wang et al., "Design of Magnetic Non-Volatile TCAM With Priority-Decision in Memory Technology for High Speed, Low Power, and High Reliability", IEEE Transactions on Circuits and Systems—I: Regular Papers, Feb. 2020, pp. 464-474.
Xunzhao Yin et al., "An Ultra-Dense 2FeFET TCAM Design Based on a Multi-Domain FeFET Model", IEEE Transactions on Circuits and Systems—II: Express Briefs, Sep. 2019, pp. 1577-1581.

* cited by examiner

HIGHLY ENERGY-EFFICIENT CAM BASED ON SINGLE FeFET AND OPERATING METHOD THEREOF

CROSS-REFERENCE TO RELATED APPLICATION

This application claims the priority benefit of China application no. 202210190672.8, filed on Feb. 28, 2022. The entirety of each of the above mentioned patent applications is hereby incorporated by reference herein and made a part of this specification.

FIELD OF TECHNOLOGY

The present invention relates to the storing field, in particular to a highly energy-efficient CAM based on a single FeFET and an operating method thereof, which considers the FeFET device to be used in the design of a low power consumption and high performance CAM with non-volatile characteristics.

BACKGROUND

A Content Addressable Memory (CAM) is a promising hardware solution for Computing in Memory (CiM), which can solve a memory wall problem in von Neumann machines. With its highly parallel search capability, the CAM has a great potential in today's data-intensive applications, including machine learning, neuromorphic computing, and look-up tables, among others.

Traditional CMOS CAMs suffer from high power consumption and low area-density, so researchers consider emerging non-volatile memory (NVM) devices, such as resistive RAMs (ReRAMs), Spin Transfer Torque Magnetic RAMs (STT-MRAMs) and Ferroelectric Field Effect Transistors (FeFETs) to be used to construct compact and efficient CAM designs. The ReRAM and STT-MRAM incorporate variable resistance and non-volatile storage characteristics to encode their Low Resistance States (LRSs)/High Resistance States (HRSs) as logical values of "1"/"0", respectively, which can be used to replace the CMOS SRAM in constructing the CAM designs. However, three-terminal FeFET devices can be used as 1T non-volatile memories or switches instead of variable resistors due to their unique hysteresis I-V characteristic curves, high switching current ratio, and high turn-off resistance. Therefore, the FeFETs have smaller area overheads and lower energy consumptions compared to the CMOS CAM designs, thus promising to construct compact and efficient CAM designs. These NVM-based innovations focus on the application of NVM in compact CAM designs, resulting in CAM cells with smaller areas, lower energy consumptions, and lower delays.

SUMMARY

The purpose of the present invention is to provide a CAM design based on a single FeFET for the problems of high energy consumption, large area overhead and poor performance of the existing CAM, and to propose a highly energy-efficient data search method to achieve a lower energy consumption and delay.

The object of the present is realized by the following technical schemes:

A highly energy-efficient CAM based on a single FeFET, wherein each CAM cell of an array is composed of 1 FeFET and 2 NMOS transistors (NMOSs), and the 2 NMOSs are divided into T1 and T2, wherein a source of the FeFET is connected to a search line SL, a gate of the FeFET is connected to a word line WL, a drain of the FeFET is connected to a drain of T1 and a gate D of T2, a source of T1 is connected to a search line $\overline{SL}$, a gate of the T1 is connected to a control line CL, a drain of T2 is connected to a match line ML, and match lines of the CAM cells in each row of the array are connected to form a match line for the row.

Further, MLs are discharged through a respective single NMOSs.

Further, each column of the array shares the same longitudinal SL and $\overline{SL}$, and each row of the ML is connected to $V_{DD}$ through a PMOS, and a detection amplifier SA is connected so as to obtain an output.

Further, the match lines MLs realize an adaptive precharge and discharge data search design method through detection amplifiers SAs each of which is based on a Threshold Inverter Quantization (TIQ) comparator, and the method can terminate the precharge and discharge process of the MLs in advance, thereby reducing an ML voltage swing, and improving the energy efficiency of the CAM.

Further, two types of storing are performed on the FeFET by an operation of the gate: 1, 0.

Further, the drain of the FeFET passes information about matching or not.

An operating method of the CAM as described above, wherein the operating method comprises:
  before the array starts to work, performing data storing on each cell, that is, after the information is encoded into a binary sequence, writing the sequence into the 1 FeFETs through the WLs;
  dividing each search period into a precharge stage and a search stage;
  the precharge stage: first setting $\overline{SL}$ to 0, setting WL to 1, so that D is fully discharged to 0, and then charging ML to a high level;
  search stage: maintaining the voltage of WL unchanged, turning off the charging of ML, and setting SL and $\overline{SL}$ to a searched voltage, wherein for a matched cell, D is 0, and ML does not discharge through the NMOS, and for an unmatched cell, D is 1, and ML discharges through the NMOS; after waiting for a period of time and the discharge process is finished, observing the output of detection amplifier in each row, wherein, if the value is 1, it means that ML of this row has discharged, and this row does not match; and if the value is 0, it means that the ML of this row has not discharged and this row matches.

The present invention has the following beneficial effects:
The CAM design in the present invention can realize energy saving and delay reduction.

(1) For the CAM design of 2T-1FeFET, in the array, each CAM cell has only one NMOS connected to the match line ML, which reduces the ML capacitance and thus reduces the precharge energy consumption. And because of the reduced ML capacitance and the reduced resistance between the ML and ground, the array consists of the CAM design of 2T-1FeFET has a smaller search delay than that of the existing CAM design. Because the number of devices in this design is small, the area of the CAM is small, and only the single FeFET is used, the design overhead is reduced, and the production cost can be reduced. In addition, this design can also be used by NVM in addition to FeFET, and has versatility.

(2) For the CAM design of 2T-1FeFET, different from the default CAM, this CAM is self-adaptive in the operation of ML precharge and discharge during each search. By using the TIQ comparator in the detection amplifier SA, when ML voltage is precharged to be higher than the threshold voltage of the detection amplifier SA, the charging is stopped. When the ML voltage is discharged below the threshold voltage of the detection amplifier SA, the discharge is stopped. This highly energy-efficient data search design method reduces the voltage swing of the ML, so it can effectively reduce the energy consumption.

DESCRIPTION OF THE EMBODIMENTS

The present invention is further described in detail in combination with the accompany drawings and specific embodiments.

Figure 1:
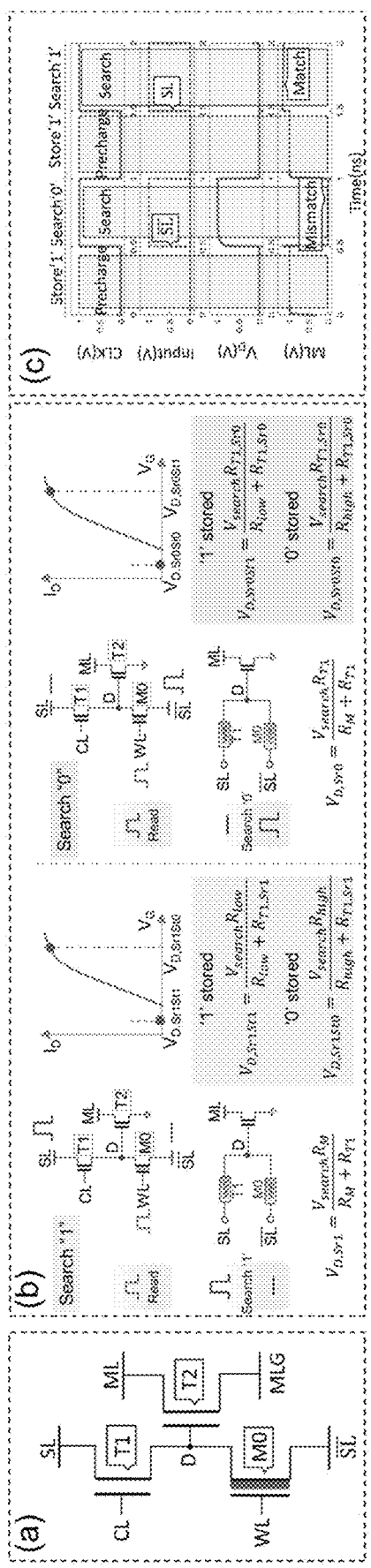
FIG. 1 is a schematic diagram of a structure of a CAM cell of a 2T-1FeFET in part (a) and an operation principle in part (b) thereof.

A highly energy-efficient CAM based on a single FeFET and an operating method thereof are shown in part (a) of FIG. 1. Each 2T-1FeFET CAM cell comprises a FeFET ($M_0$) and two NMOSs, and the two NMOSs are $T_1$ and $T_2$, wherein the source of the FeFET device $M_0$ is connected to a search line $\overline{SL}$, and the gate thereof is connected to a word line WL, and the drain thereof is connected to the drain of the NMOS device $T_1$ and the gate D of $T_2$, the source of $T_1$ is connected to a search line SL, the gate thereof is connected to a control line CL, the drain of $T_2$ is connected to a match line ML, and the source thereof is connected to a node MLG, which is related to an adaptive data search design method of ML precharge and discharge adopted in the present invention.

$M_0$ and $T_1$ are connected in series on the left side of the cell to form a voltage divider circuit, which is powered by the search lines SL and $\overline{SL}$. The voltage divider circuit can realize an XOR operation between search data and stored word, so that the voltage of an internal node D is high only when mismatch occurs, otherwise the voltage is low when match occurs. As the node D is connected to the gate of $T_2$, a desired XNOR operation can be implemented in the CAM cell, and when a mismatch occurs, ML discharges.

FIG. 1 in part (b) explains an operating principle of the 2T-1FeFET CAM cell. When searching for logic "1" in the CAM cell, SL and $\overline{SL}$ are at high and low levels, respectively. Therefore, the voltage of the node D during searching for "1" is:

$$V_{D,Sr1} = \frac{V_{search}R_{M0}}{R_{M0} + R_{T1,Sr1}}$$

Wherein $V_{search}$ is the voltage on SL, $R_{T1,Sr1}$ is the resistance of a $T_1$ transistor during searching for "1", and $R_{M0}$ is the resistance of the FeFET, which can be $R_{low}$ or $R_{high}$ and depends on the state of $V_{TH}$ of the FeFET. Therefore, when storing state "1" (i.e. a low $V_{TH}$ state or $R_{low}$), the voltage of the node D is as follows:

$$V_{D,Sr1Sr1} = \frac{V_{search}R_{low}}{R_{low} + R_{T1,Sr1}}$$

When storing state "0" (i.e. a high $V_{TH}$ state or $R_{high}$), the voltage of the node D is as follows:

$$V_{D,Sr1Sr0} = \frac{V_{search}R_{high}}{R_{high} + R_{T1,Sr1}}$$

Therefore, by choosing an appropriate control bias for the transistor $T_1$, its resistance $R_{T1,Sr1}$ can be set between $R_{low}$ and $R_{high}$, so that the corresponding $V_{D,Sr1Sr1}$ and $V_{D,Sr1Sr0}$ are lower than and higher than $V_{TH}$ of the transistor $T_2$ respectively, thus achieving match and mismatch operations.

Similarly, when searching for logic "0", the voltages on SL and $\overline{SL}$ are reversed. The voltage of the node D is:

$$V_{D,Sr0} = \frac{V_{search}R_{T1,Sr0}}{R_{M0} + R_{T1,Sr0}}$$

By setting the resistance $R_{T1,Sr0}$ of $T_1$ between $R_{low}$ and $R_{high}$, when "1" is stored, the voltage of the node D is:

$$V_{D,Sr0Sr1} = \frac{V_{search}R_{T1,Sr0}}{R_{low} + R_{T1,Sr0}}$$

When "0" is stored, the voltage of the node D is as follows:

$$V_{D,Sr0Sr0} = \frac{V_{search}R_{T1,Sr0}}{R_{high} + R_{T1,Sr0}}$$

Therefore, $V_{D,Sr0Sr1}$ and $V_{D,Sr0Sr0}$ are above and below $V_{TH}$ of the transistor $T_2$, respectively, thus correctly implementing the function of searching for "0".

Figure 2:
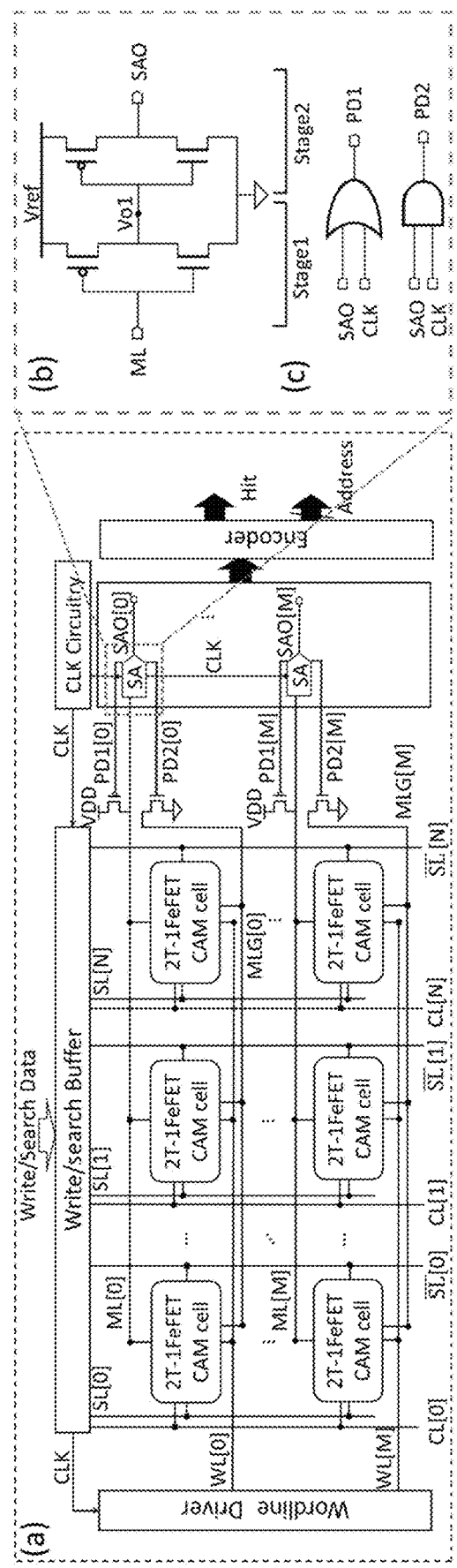
FIG. 2 is a structural diagram of a CAM array of a 2T-1FeFET in part (a) and a TIQ comparator in SA thereof in part (b) and an output peripheral circuit thereof in part (c)

2. Overall Structure and Operation Process of the CAM Array of 2T-1FeFET:

As shown in part (a) of FIG. 2, the CAM array of 2T-1FeFET comprises a CAM core of M rows and N columns, a write/search buffer, a word line driver, output detection amplifiers SAs and a peripheral circuit. Multiple cells in the array are connected to ML and WL in parallel to form a row, each column shares the same longitudinal SL ($\overline{SL}$) and CL, each ML is connected to $V_{DD}$ through a PMOS, and also connected to the detection amplifier SA so as to obtain an output. The SA detects the voltage of ML and outputs a match/dismatch result, denoted as SAO. FIG. 2 in parts (b) and (c) show an internal structure of the SA, which comprises a TIQ comparator and two logic gates. The TIQ comparator formed by cascading two inverters is driven by a reference voltage $V_{ref}$, and the voltage of ML is compared with a threshold voltage of the inverters. OR and AND gates are used to generate PD1 and PD2 control signals. When CLK and SAO are both at low levels, PD1 is also at a low level, ML is precharged; and, when CLK and SAO are both at high levels, PD2 is also at a high level, and ML is pulled down for discharge. Note that MLG nodes of all the CAM cells in each row are grounded by the same pull-down transistor that is gated by PD2, while the gate of the PMOS transistor precharged by ML is controlled by the PD1 signal.

The whole operation process of the CAM array of the 2T-1FeFETs is as follows:

(1) before the array consisting of the CAMs of the 2T-1FeFETs starts to work, performing data storing on each cell, that is, after the information is encoded into a binary sequence, performing writing on the 1FeFET through the WL, wherein the written state is represented by S. In addition, in writing operations, the $V_{write}/2$ suppression bias scheme needs to be applied to all WLs related to unselected rows and $\overline{SL}$s related to unselected columns to avoid to write interference.

(2) For each search cycle, it is divided into two stages:

(2.1) a precharge stage: first setting $\overline{SL}$ to 0, setting WL to 1, so that D is fully discharged to 0, and then CLK and SAO are both 0; also setting the gate PD1 of PMOS to 0, and precharging ML to a high level;

(2.2) a search stage:

maintaining the voltage of WL unchanged, with CLK and SAO are both 1; setting PD1 to 1; turning off the charging of ML, setting PD2 to 1; turning on the pull-down transistor; connecting all CAM cells to ground through MLGs, and setting SL and $\overline{SL}$ to be the searched voltage.

At this time, for a matched cell, D is 0 and ML does not discharge through the NMOS; for a mismatched cell, D is 1 and ML discharges through the NMOS. Therefore, in the case of mismatch, ML is discharged to the ground through the mismatched CAM cell and pull-down transistor, while in the case of match, ML remains at an original level, because there is no discharge path. After waiting for a period of time, the discharge process is finished, and the output of the detection amplifier SA in each row is observed. The TIQ comparator in the SA compares the ML voltage with the threshold voltage and generates the output signal. If the output is at a high level, it indicates that the input of the SA is at a low level, showing that there is discharge in ML of this row, and the row does not match. Otherwise, if the output is at a low level, it indicates that the input of the SA is at a high level, showing that the ML of this row is not discharged and the row matches.

The truth value table for write and search is shown in the following table (where a write voltage $V_w=4V$, a search voltage $V_s=1V$):

| Mode | SL | $\overline{SL}$ | WL | CL | S | D | ML |
|---|---|---|---|---|---|---|---|
| Writing "1" | 0 | 0 | $V_w$ | $V_s$ | 1 | — | — |
| Writing "0" | 0 | 0 | $-V_w$ | $V_s$ | 0 | — | — |
| Searching for "1" | $V_s$ | 0 | $V_{Read}$ | $V_s$ | 1 | Low | Match |
|  |  |  |  |  |  | 0 High | Mismatch |
| Searching for "0" | 0 | $V_s$ | $V_{Read}$ | 0 | 1 | High | Mismatch |
|  |  |  |  |  |  | 0 Low | Match |

Figure 3:
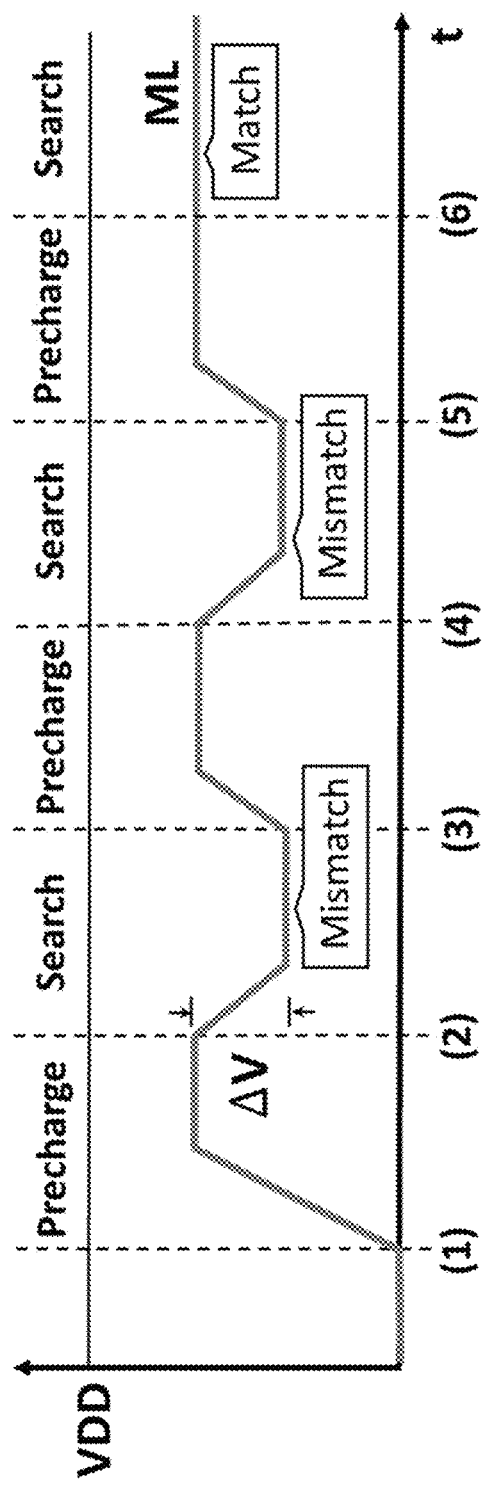
FIG. 3 is a scheme diagram of adaptive ML precharge and discharge.

3. Adaptive ML Precharge and Discharge Scheme:

FIG. 3 shows the adaptive ML precharge and discharge scheme employed in the present invention. This scheme starts with ML precharge at time point (1) and the precharge terminates when the SA detects that the ML voltage exceeds a threshold voltage, instead of precharging ML to the supply voltage $V_{DD}$ as a default CAM does. Immediately after this, the search operation starts from time point (2), and when the match occurs, ML remains at its original voltage level and there is no discharge path, while when the mismatch occurs, there is a discharge path and ML is discharged. Once the ML voltage is below the threshold voltage, the SA turns off the discharge path to terminate the discharge.

Since the precharge energy consumption $E_{pre}$ of the CAM array is expressed as follows:

$$E_{pre}=C_{ML}V_{DD}\Delta V$$

Wherein $C_{ML}$ is the associated capacitance of ML, $V_{DD}$ is the supply voltage, and $\Delta V$ is the voltage swing of ML. Therefore, this scheme saves the energy consumption of precharge by reducing $\Delta V$.

The functions and effects of the present invention are further illustrated and demonstrated by the following simulation experiment:

1. Simulation Conditions

The FeFETs are simulated by using a compatible SPECTRE and SPICE model based on a physical circuit, wherein the model is based on the Preisach model. This model achieves an efficient design and analysis, and has been widely used in the FeFET circuit design. It supports 45 nm, 22 nm or 10 nm Predictive Technology Models (PTMs) as basic transistors. The basic transistor used in the simulation is a PTM 45 nm model. The voltage is set to 1V.

During the simulation, for the CAM design of the 2T-1FeFET, a SPECTRE software is used to simulate. In addition to the simulation of the CAM design in the present invention, we compare our results with four CAM designs mentioned in a non-patent document 1 (A. T. Do et al., "Design of a power-efficient cam using automated background checking scheme for small match line swing," in ESSCIRC, pp. 209-212, IEEE, 2013), non-patent document 2 (J. Li et al., "1 mb 0.41 µm² 2t-2r cell nonvolatile tcam with two-bit encoding and clocked self-referenced sensing," JSSC, vol. 49, pp. 896-907, 2014), non-patent document 3 (C. Wang et al., "Design of magnetic non-volatile tcam with priority-decision in memory technology for high speed, low power, and high reliability," IEEE TCAS-I, vol. 67, no. 2, pp. 464-474, 2019) and a non-patent document 4 (X. Yin et al., "An ultra-dense 2fefet tcam design based on a multidomain fefet model," IEEE TCAS-II, vol. 66, pp. 1577-1581, 2018.).

The comparison metrics mainly include the number of transistors, the area of each CAM cell, the search delay and the search energy consumption each time when searching for each CAM cell. For the CAM design in the present invention, the measurement delay is the delay in the worst case, that is, only one CAM cell does not match with discharge; and, energy consumption is measured using the average case of energy consumption, that is, half of the CAM cells in a row match with discharge, and half of the CAM cells do not match with discharge.

Figure 4:
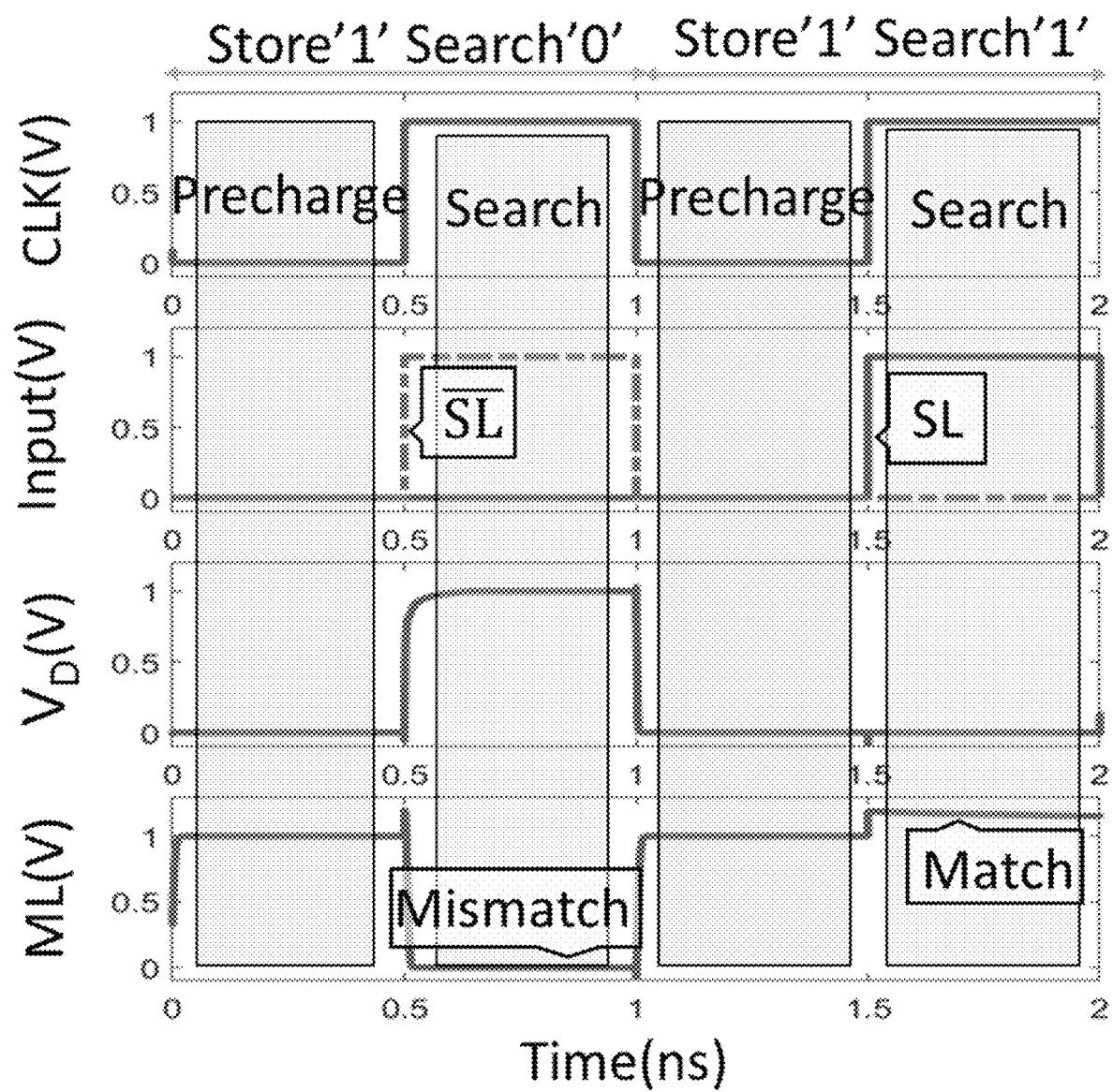
FIG. 4 is simulation waveforms of a CAM cell of a 2T-1FeFET in case that 1 is written.

2. Simulation Results
1) Verification of Non-Volatility 1.1) FIG. 4 shows the simulation waveforms of the CAM cell of the 2T-1FeFET in the case of writing 1. The first search verifies "writing 1, searching for 0", the node D is at a high level, and the result does not match. The second search verifies "writing 1, searching for 1", the node D is at a low level and the result matches. The simulation results show that the node D is at a high level only when the result does not match, and it also shows that the CAM cell design of the 2T-1FeFET is non-volatile.

Figure 5:
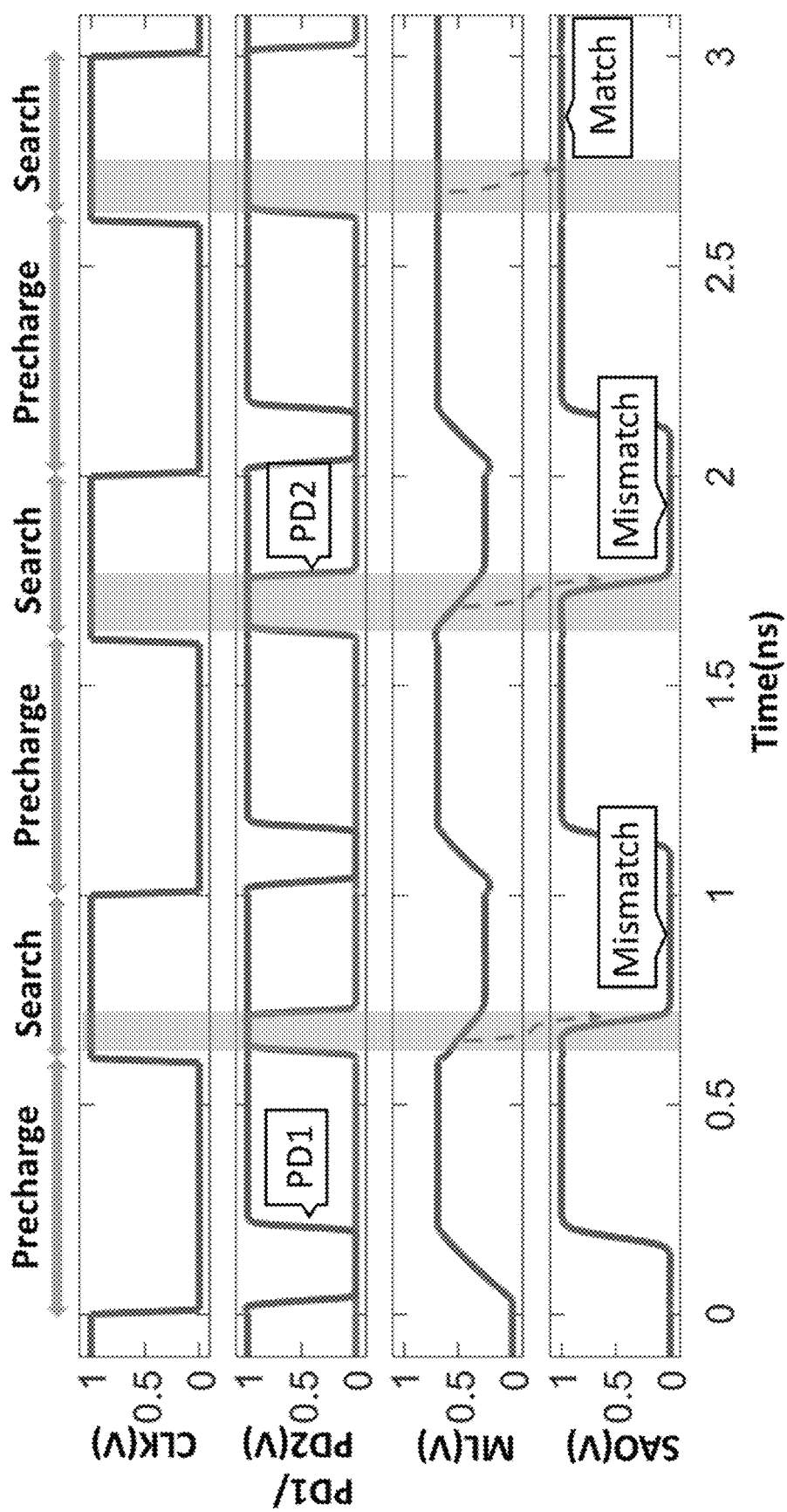
FIG. 5 is simulation waveforms of a CAM array of 2T-1FeFETs under an adaptive ML precharge and discharge scheme.

1.2) FIG. 5 shows simulation waveforms of a CAM array of 2T-1FeFETs under an adaptive ML precharge and discharge scheme. During the precharge of the search operation, the ML voltage is lower than the threshold voltage $V_{th}$ of the TIQ comparator, so SAO outputted by the TIQ comparator is at a low level. At this time, the clock signal CLK is also at a low level, so that both PD1 and PD2 are at low levels. Turning off the pull-down transistor and turning on the precharge PMOS to precharge ML. Once the ML voltage is precharged beyond $V_{th}$, SAO becomes a high level and the drive PD1 rises to a high level, thus terminating the precharge process. When the search begins, both CLK and SAO are at high levels and PD2 is therefore driven to a high level, so as to turn on the pull-down NMOS transistor. When match, ML still keeping at a higher level and SAO keeping at a high level means match. When mismatch, ML has a discharge path to the ground, and when the ML voltage is lower than $V_{th}$, the output SAO is 0, so PD2 is also be driven to 0, making the pull-down transistor be turned off, and the discharge is terminated. In the three search cases in FIG. 5, the first search and the second search both mismatches, and the third search matches. The simulation results show that the CAM array design of the 2T-1FeFETs is non-volatile.

Figure 6:
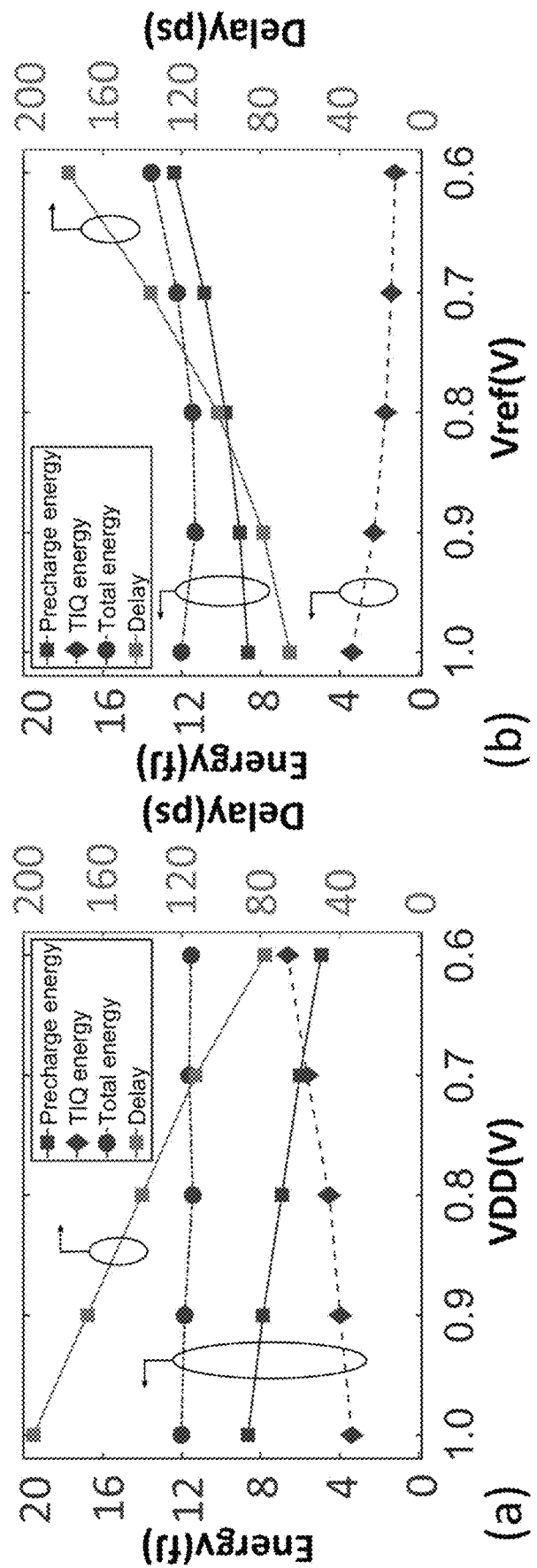
FIG. 6 shows change curves of energy consumptions and delays under $V_{DD}$(a) and $V_{ref}$ (b) regulation.

2) Energy Consumption and Delay Analysis Under $V_{DD}$ and $V_{ref}$ Adjustment FIG. 6 in part (a) and part (b) show the energy consumption and delay variation of a word in the 2T-1FeFET CAM array in the present invention under $V_{DD}$ and $V_{th}$ adjustment, respectively. The search energy consumption of the CAM array is mainly consisted of two parts: (i) the energy consumption of precharge associated with ML, and (ii) the energy consumption of the SA. ML precharge energy consumption depends on the associated capacitance of ML and voltage swing of ML, while the SA energy consumption is mainly controlled by the TIQ comparator. As shown in part (a) of FIG. 6, with the decrease of $V_{DD}$, the precharge intensity weakens and the upper limit of the voltage swing decreases, and then the reduced ML voltage swing leads to the reduction of precharge energy consumption and search delay. However, the reduced voltage swing means that the ML voltage fluctuates around the threshold voltage of the TIQ comparator, thus tending to maintain the conducting current of the transistors in the comparator, which leads to a higher static power consumption. Therefore, the change of total energy consumption is negligible. On the contrary, reducing $V_{ref}$ would reduce the response speed of the TIQ comparator, resulting in longer precharge and discharge time and a larger voltage swing, that is, leading to a greater search delay and a precharge energy consumption, as shown in part (b) of FIG. 6. In general, the change of total energy consumption is negligible.

Based on the above analysis, reducing $V_{ref}$ would reduce the energy consumption of the SA at the expense of increasing the ML voltage swing, which can be partially solved by lowering $V_{DD}$ so as to reduce the upper bound of the voltage swing.

3) Energy Consumption and Delay Analysis Under Different Word Length

Figure 7:
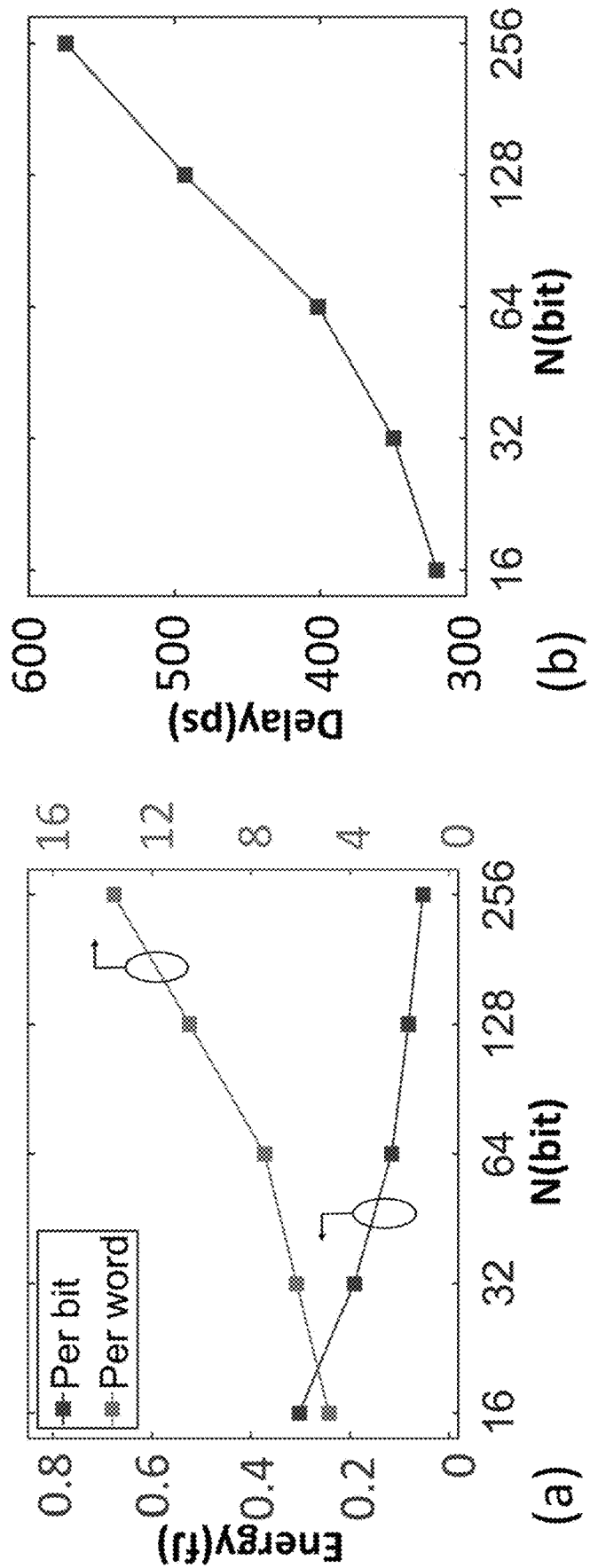
FIG. 7 shows change curves of energy consumptions in part (a) and delays in part (b) under different word lengths; and, FIG. 8 shows a simulation waveform of a CAM array of 2T-1FeFETs in case that device process varies.

According to the voltage regulation analysis, we used the lowest operating $V_{DD}$ (0.6V) and $V_{ref}$ (0.6V). Part (a) and part (b) in FIG. 7 show the search energy consumptions and delays of the 2T-1FeFET CAM array in the present invention under different word lengths, respectively. As the word length increases, the corresponding ML associated capacitance increases, which reduces the precharge and discharge speed, leading to an increase in the search delay. With the increase of capacitance, the precharge energy consumption of each word also increases. However, increasing the word length has a negligible effect on SA energy consumption because the SA energy consumption depends on the TIQ comparator. In this sense, as the word length increases, the search energy consumption per bit decreases gradually.

4) Robustness Verification Against Process Change

Figure 8:
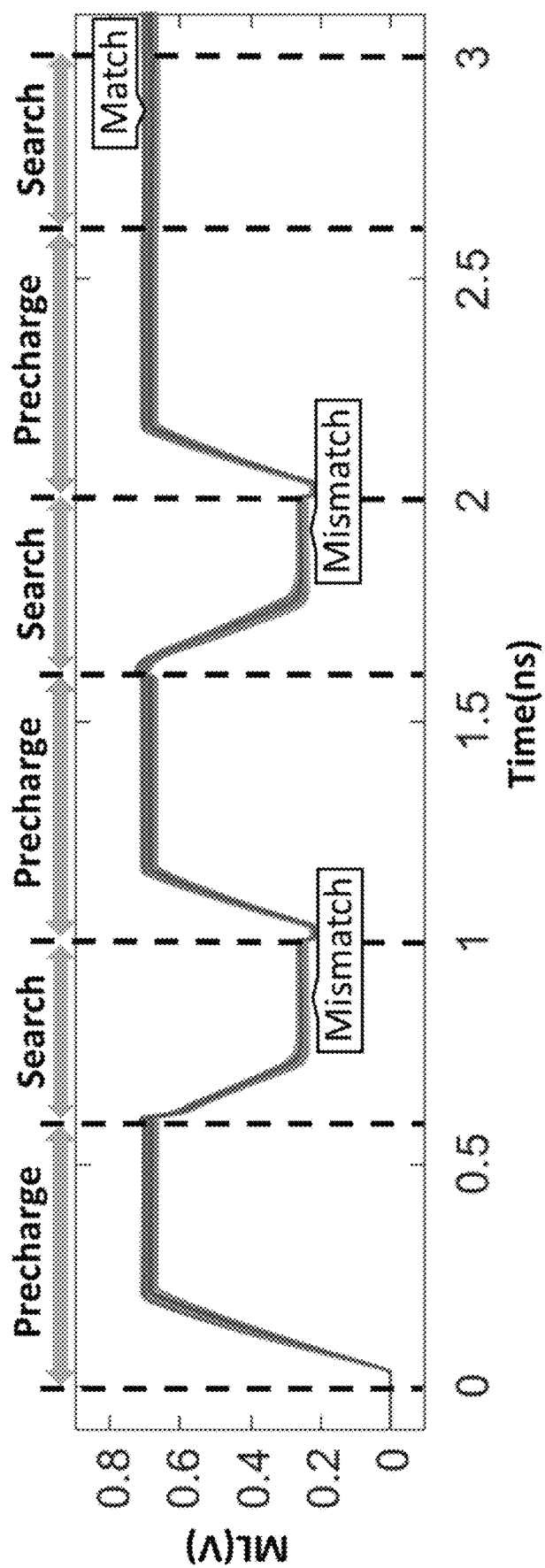

We also verify the robustness of the 2T-1FeFET CAM design and the adaptive ML precharge and discharge scheme in the present invention. We assume that the FeFET device has an experimental variation of σ=54 mV in the low/high $V_{th}$ state, whereas the CMOS device has a 5% size variation. FIG. 8 shows a simulation waveform of ML during the search operation, wherein the CAM array already comprises the process change. The 200 Monte Carlo simulation results in FIG. 8 show that the 2T-1FeFET CAM array in the present invention can achieve error-free search, which illustrates the reliability and robustness of the data search design method proposed in the present invention.

5) Optimization of Energy Consumption

The following table presents the comparison of the metrics of the CAM design based on the single FeFET in the present invention with other CAM designs.

| Reference documents | Non-patent document 1 | Non-patent document 2 | Non-patent document 3 | Non-patent document 4 | The present invention |
|---|---|---|---|---|---|
| Main technique | CMOS | ReRAM | STT-MRAM | FeFET | FeFET |
| Number of transistors per CAM cell | 10T | 2T-2R | 20T-6MTJ | 2FeFET | 2T-1FeFET |
| Area per CAM cell (μm²) | 3.3 | 0.41 | 18.05 | 0.15 | 0.36 |
| Search delay | 1.07 ns | 350.6 ps | 170 ps | 340.8 ps | 401.4 ps |
| Energy consumption [fJ/bit/search] | 0.77 6.64X | 0.55 4.74X | 1.06 9.14X | 0.35 3.02X | 0.116 1X |

The above table summarizes the technical metrics of the 2T-1FeFET CAM and other CAMs, wherein the cell size is estimated based on the 2X2 2T-1FeFET CAM array layout.

As can be seen from the above table, the cell size of 2T-1FeFET CAM is 10.9% of that of traditional 10T CMOS CAM. The smaller the area overhead of the CAM, the smaller the ML associated parasitic capacitance, thus reducing the search energy and search delay. With the 1FeFET-based CAM design and adaptive ML precharge and discharge scheme, the 2T-1FeFET CAM saves 6.64 times of energy consumption and reduces the delay by 2.67 times compared with the 10T CMOS CAM design. Because the present invention adjusts $V_{DD}$ and $V_{ref}$ in order to reduce the ML voltage swing and search energy consumption, the 2T-1FeFET CAM is slightly slower than the 2T-2R CAM and the 2FeFET CAM, but still within an acceptable range as the 2T-1FeFET CAM design is 4.74 times more energy efficient than the 2T-2R CAM design, and is 3.02 times more energy efficient than the 2FeFET CAM design. While the search delay of the STT-MRAM CAM is only 42% of that of the 2T-1FeFET CAM, the cell size of the 2T-1FeFET CAM is only 1.99% of that of the STT-MRAM CAM, thus yielding a huge density advantage that can compensate for the slightly reduced performance. Moreover, the 2T-1FeFET CAM saves 9.14 times of energy consumption compared with the 20T-6MTJ CAM.

It can be seen from the above results that the present invention not only has non-volatility which is difficult to achieve by the CMOS design, and robustness against the process changes, but also has the characteristics of compact design, low energy consumption and low delay. In addition, the above results also validate the effectiveness of the 2T-1FeFET CAM array of the adaptive ML precharge and discharge scheme in data-intensive search applications.

The above embodiments are used to explain the present invention, not to restrict it, and without departing the spirit and protection scope of present invention, any modification or alteration made to the present invention falls within the protection scope of the present invention.

What is claimed is:

1. A highly energy-efficient content addressable memory (CAM) based on a single FeFET, wherein each CAM cell of the CAM is composed of 1 FeFET and 2 NMOS transistors (NMOSs), and the 2 NMOSs are divided into T1 and T2, a source of the FeFET is connected to a search line/SL, a gate of the FeFET is connected to a word line WL, a drain of the FeFET is connected to a drain of T1 and a gate D of T2, a source of T1 is connected to a search line SL, a gate of the T1 is connected to a control line CL, a drain of T2 is connected to a match line, and match lines of CAM cells in each row of an array are connected forming a match line ML for each respective row, wherein each column of the array shares a respective SL and/SL, and each of the MLs is connected to VDD through a respective PMOS, and is connected to a respective detection amplifier SA so as to obtain a respective output.

2. The highly energy-efficient CAM based on a single FeFET according to claim 1, wherein the match line ML for each row is discharged through a single respective NMOS.

3. The highly energy-efficient CAM based on a single FeFET according to claim 1, wherein the match lines MLs realize an adaptive precharge and discharge data search design method through the detection amplifier SAs each of which is based on a threshold inverter quantization comparator, and the method can terminate precharge of the MLs before the MS is precharged to $V_{DD}$, thereby reducing an ML voltage swing, and improving the energy efficiency of the CAM.

4. The highly energy-efficient CAM based on a single FeFET according to claim 1, wherein storing a "1" and storing a "0" are two types of storing that are performed on the FeFET by operating the gate of the FeFET.

5. The highly energy-efficient CAM based on a single FeFET according to claim 1, wherein the drain of the FeFET passes information about matching or not.

6. An operating method for the CAM according to claim 1, wherein the operating method comprises:
   before the array starts to work, performing data storing on each cell, wherein information is written into the FeFETs through the WLs after the information is encoded into a binary sequency;
   dividing each search period into a precharge stage and a search stage;
   the precharge stage: first setting SL to 0, setting WL to 1, so that D is fully discharged to 0, and then charging ML to a high level;
   search stage: maintaining the voltage of WL unchanged, turning off the charging of ML, and setting SL and $\overline{SL}$ to a searched voltage, wherein for a matched cell, D is 0, and ML does not discharge through the NMOS, and for an unmatched cell, D is 1, and ML discharges through the NMOS;
   after waiting for a period of time and the discharge process has finished, observing an output of the detection amplifier in each row, wherein, if the output value is 1, it means that ML of the respective row has discharged, and the respective row does not match; and
   if the value is 0, it means that the ML of the respective row has not discharged and the respective row matches.

* * * * *